US009006105B2

(12) United States Patent
Lu et al.

(10) Patent No.: US 9,006,105 B2
(45) Date of Patent: Apr. 14, 2015

(54) METHOD OF PATTERNING PLATINUM LAYER

(71) Applicant: United Microelectronics Corp., Hsin-Chu (TW)

(72) Inventors: Hsin-Yi Lu, Taipei (TW); Yu-Chi Lin, Hsinchu (TW); Jeng-Ho Wang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/953,753

(22) Filed: Jul. 30, 2013

(65) Prior Publication Data

US 2015/0037974 A1  Feb. 5, 2015

(51) Int. Cl.
*H01L 21/3213*    (2006.01)
*H01L 21/4763*    (2006.01)
*B81C 1/00*       (2006.01)

(52) U.S. Cl.
CPC ...... *B81C 1/00531* (2013.01); *H01L 21/32135* (2013.01)

(58) Field of Classification Search
USPC .......................................... 438/742
See application file for complete search history.

(56) References Cited

U.S. PATENT DOCUMENTS

| 3,923,568 | A | * | 12/1975 | Bersin | 216/67 |
| 5,854,104 | A | * | 12/1998 | Onishi et al. | 438/240 |
| 6,323,132 | B1 | | 11/2001 | Hwang | |
| 8,158,445 | B2 | | 4/2012 | Ryu | |

* cited by examiner

*Primary Examiner* — Stephen W Smoot
(74) *Attorney, Agent, or Firm* — Winston Hsu; Scott Margo

(57) ABSTRACT

A method of patterning a platinum layer includes the following steps. A substrate is provided. A platinum layer is formed on the substrate. An etching process is performed to pattern the platinum layer, wherein an etchant used in the etching process simultaneously includes at least a chloride-containing gas and at least a fluoride-containing gas.

15 Claims, 6 Drawing Sheets

METHOD OF PATTERNING PLATINUM LAYER

BACKGROUND OF THE INVENTION

1. Field of the Invention

The present invention relates to a method of patterning platinum (Pt) layer, and more particularly, to a method of patterning a platinum layer, wherein an etchant used in the patterning process includes at least a chloride-containing gas and at least a fluoride-containing gas.

2. Description of the Prior Art

Along with the development of technology and the improvement of the semiconductor techniques, electronic devices are widely used in modern life. Micro-electro-mechanical system (MEMS) technology is used to fabricate micro mechanical devices by using conventional semiconductor technologies like electroplating, or etching, such that a mechanical component in a micro-meter scale may be formed. The MEMS devices may be applied, for example, in the voltage controlling component in an ink printer, the gyroscope in a car to detect the tilt of the car, the vibration membrane in a microphone to sense a sound, or the micro-heaters in air detectors, chemical detectors, and polymerase chain reaction (PCR) biological chips to provide a local heating function. The MEMS technology which combines the fabrication process of the mechanical and the electronic devices has the advantages of low costs, high performances and high density.

Platinum (Pt), the promising material, can be widely used in very-large-scale integration (VLSI) and MEMS field as electro-thermal, humidity and gas sensor due to its chemical stability and excellent oxidation resistance. Pt also has a high work function and forms a high potential barrier against electron transfer at the interface with the dielectric material, which may suppress leakage current. The MEMS structure made of Pt could be formed through dry etching process accompanied with a photoresist mask; however, some byproducts, such as fence polymer, may be formed at the sides of the formed Pt structure after the dry etching process. The fence polymer is hard to remove, which causes deformations of the formed MEMS structures. Accordingly, a way to pattern the Pt layer to form proper structures without unwanted byproducts to be further used in the MEMS field is an important issue.

SUMMARY OF THE INVENTION

An objective of the present invention is therefore to provide a method of patterning platinum layer to avoid the formation of byproducts such as fence polymer and obtain a predetermined pattern.

According to one exemplary embodiment of the present invention, a method of patterning platinum layer includes the following steps. A substrate is provided. A platinum layer is formed on the substrate. An etching process is performed to pattern the platinum layer, wherein an etchant used in the etching process includes at least a chloride-containing gas and at least a fluoride-containing gas.

The platinum layer is preferably patterned by using the etchant including simultaneously the chloride-containing gas and the fluoride-containing gas to reduce the polymer residues formation. More specifically, the chloride-containing gas facilitates a removing rate of the platinum layer, but may cause the formation of macro-molecular byproducts that are hard to be removed at the sides of the patterned platinum layer, such as fence polymer. The fluoride-containing gas used in the etching process may cause the formation of volatile byproducts that can be easily removed, but have a lower removing rate of the platinum layer than that of the chloride-containing gas. Accordingly, the gas ratio of the chloride-containing gas to the fluoride-containing gas should be modified to be substantially equal to or lower than 1 and higher than 0, in order to avoid the fence polymer formation and improve the platinum patterning process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
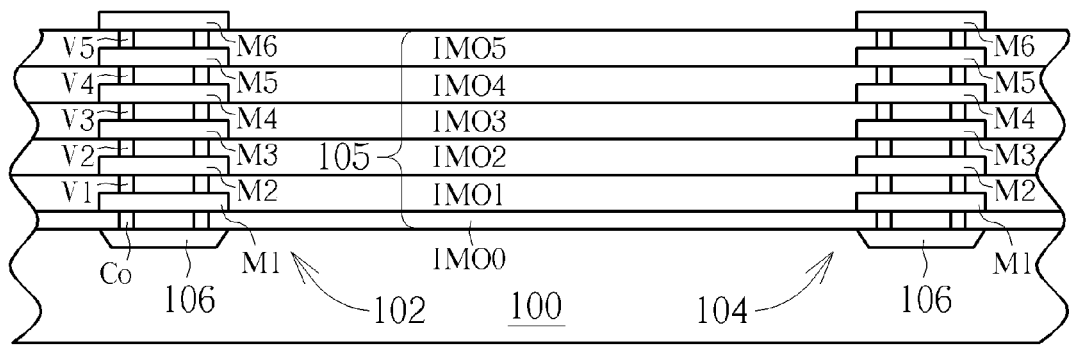
FIG. 1 through FIG. 10 are schematic diagrams illustrating a method of patterning a platinum layer according to a preferred exemplary embodiment of the present invention.

Please refer to FIG. 1 through FIG. 10, which are schematic diagrams illustrating a method of patterning a platinum layer according to a preferred exemplary embodiment of the present invention. As shown in FIG. 1, a substrate 100 is provided, and the substrate 100 includes at least one conductive element stack 102/104 and at least one dielectric layer 105 disposed thereon. The substrate 100 could be a substrate composed of Si, AsGa, silicon on insulator (SOI) layer, an epitaxial layer, a SiGe layer or other semiconductor materials. In this exemplary embodiment, each of the conductive element stacks 102/104 includes a stack of metal/contact/via layers, for example, metal layers M1-M6, via layers V1-V5, and a contact metal layer Co. Furthermore, the dielectric layer 105 could include multi sub dielectric layers such as inter-metal oxide layers IMO0-IMO5 disposed on the substrate 100 to surround the conductive element stacks 102/104 to insulate the conductive element stacks 102/104 from each other. The material of the dielectric layer 105 may include low dielectric constant (low-K) material (K value smaller than 3.9), ultra low-K (ULK) material (K value smaller than 2.6), or porous ULK material. The number of conductive element stacks, the number of metal layers and the number of via layers in each conductive element stack are not limited thereto. The methods for forming the conductive element stacks and the dielectric layer are known to those skilled in the art, so the details are omitted herein for brevity.

The substrate 100 further includes a plurality of conductive regions 106 and a base layer (not shown) covering the conductive regions 106. The conductive regions 106 could be gate electrodes, source electrodes, contact plugs, via plugs, conductive lines, or metal contacts. The base layer could be made of dielectric material, for example, the base layer may be a nitrogen doped silicon carbide (NDC) layer, but not limited thereto. The conductive element stacks 102/104 can be respectively connected to the corresponding conductive region 106 through the base layer, and not be connected to each other.

Figure 2:
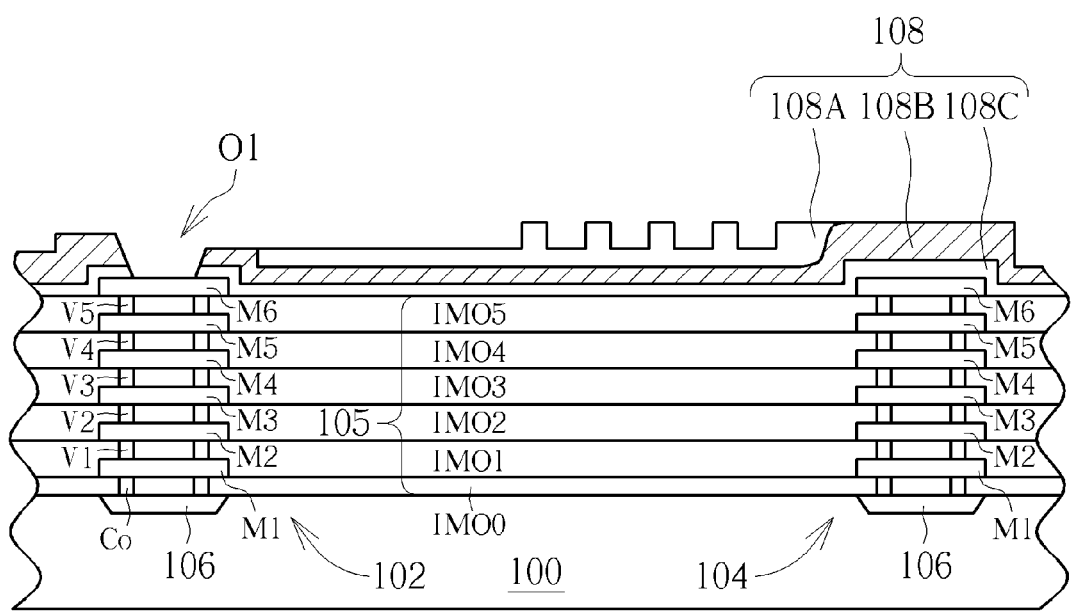

As shown in FIG. 2, a first dielectric material layer (not shown) is formed on the conductive element stack 102/104 and the dielectric layer 105, and a patterning process is performed on the first dielectric material layer to form a patterned first dielectric material layer 108. The first dielectric material layer could be a single-layered structure or a multi-layered structure. In this exemplary embodiment, the multi-layered first dielectric material layer is made of different dielectric material layers such as a bottom oxide layer, a nitride layer and a top oxide layer, in which the nitride layer could be selected from a silicon oxynitride (SiON) layer, a silicon nitride (SiN) layer or a combination thereof and the oxide layers could be selected from tetraethylorthosilicate (TEOS) layer, fluorinated silicate glass (FSG) layer, or undoped silicate glass (USG) layer. The patterning process could include multi etching processes modified according to the composition of the first dielectric material layer, therefore, a predetermined profile of the patterned first dielectric material layer 108 can be obtained. For example, a first etching process is performed to remove a part of the top oxide layer to form a plurality of protrusions and expose a part of the nitride layer underneath, then, a second etching process is performed to remove a part of the top oxide layer, a part of the nitride layer and a part of the bottom oxide layer, and an etchant having etching selectivity between the oxide layer and the nitride layer could be used to form an opening O1 in the nitride layer and a part of the top oxide layer remains on the nitride layer. Therefore, the formed patterned first dielectric material layer 108 including the patterned top oxide layer 108A, the patterned nitride layer 108B and the patterned bottom oxide layer 108C is completed. The patterned first dielectric material layer 108 exposes a part of the conductive element stack 102, and totally covers another conductive element stack 104.

Figure 3:
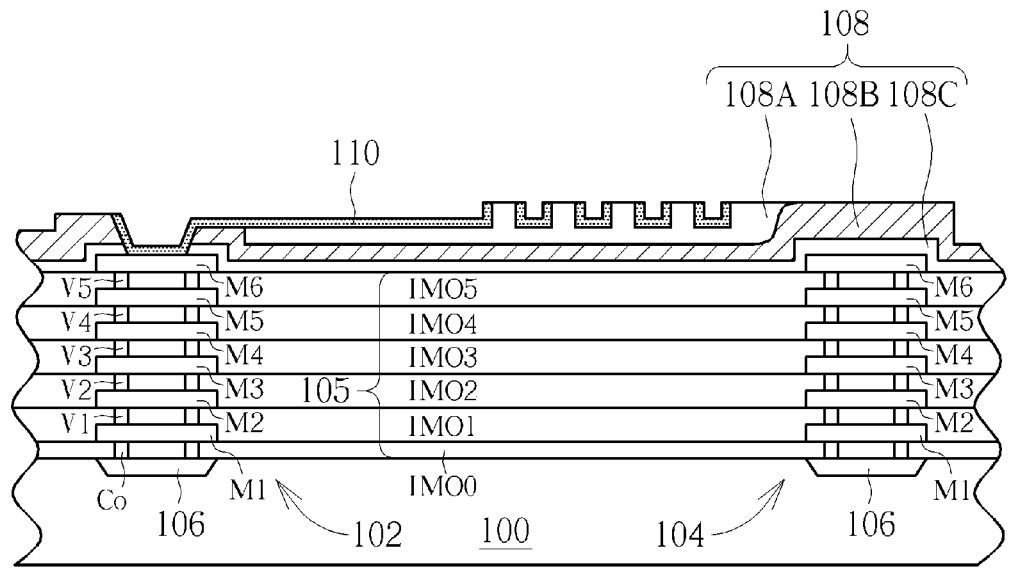

As shown in FIG. 3, a first conductive material layer (not shown) is conformally formed on the patterned first dielectric material layer 108 through a physical vapor deposition (PVD) process, such as a sputtering process and an evaporation process, a chemical vapor deposition (CVD) process, or other thin-film deposition processes. The first conductive material layer could be made of conductive material including opaque metal such as aluminum (Al), molybdenum (Mo), chromium (Cr), tungsten (W), copper (Cu) or any combination thereof, but not limited thereto, or other proper transparent conductive material. Subsequently, a patterned photoresist layer is formed on the first conductive material layer, and an etching process is further performed to remove the unwanted conductive material layer to form the predetermined first electrode 110. In this exemplary embodiment, the conductive material layer is made of tungsten (W), and because of the material property of withstanding extreme temperatures of tungsten (W), the first electrode 110 can be used to serve as heater of the micro-heating apparatus in the micro-electro-mechanical system (MEMS) field.

Figure 4:
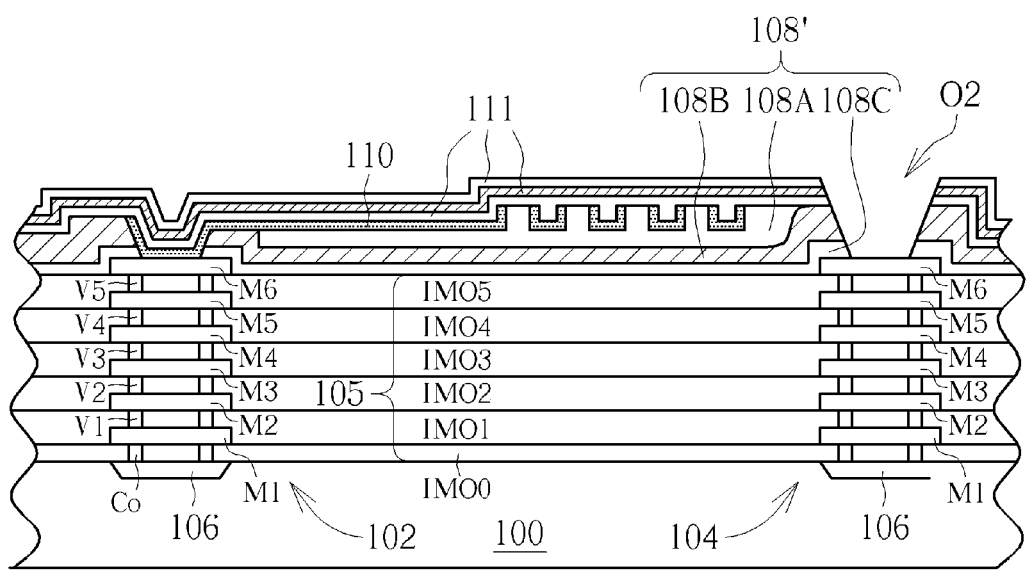

As shown in FIG. 4, a second dielectric material layer (not shown) is formed on the first electrode 110 and the patterned first dielectric material layer 108, and a patterning process is performed to remove a part of the second dielectric material layer and a part of the patterned first dielectric material layer 108, to form a patterned first dielectric material layer 108' and a patterned second dielectric material layer 111 including an opening O2 exposing the conductive element stacks 104. The second dielectric material layer could be a single-layered structure or a multi-layered structure. In this exemplary embodiment, the multi-layered second dielectric material layer includes different dielectric material layers such as oxide layer/nitride layer/oxide layer (ONO), in which the nitride layer could be selected from a silicon oxynitride (SiON) layer, a silicon nitride (SiN) layer or a combination thereof and the oxide layer could be selected from tetraethylorthosilicate (TEOS) layer, fluorinated silicate glass (FSG) layer, or undoped silicate glass (USG) layer. The materials of the oxide and the nitride layer of the second dielectric material layer are preferably the same as the materials of the oxide and the nitride layer of the first dielectric material layer, in order to simplify the patterning process of forming the opening O2 through the patterned first dielectric material layer 108' and the patterned second dielectric material layer 111.

Figure 5:
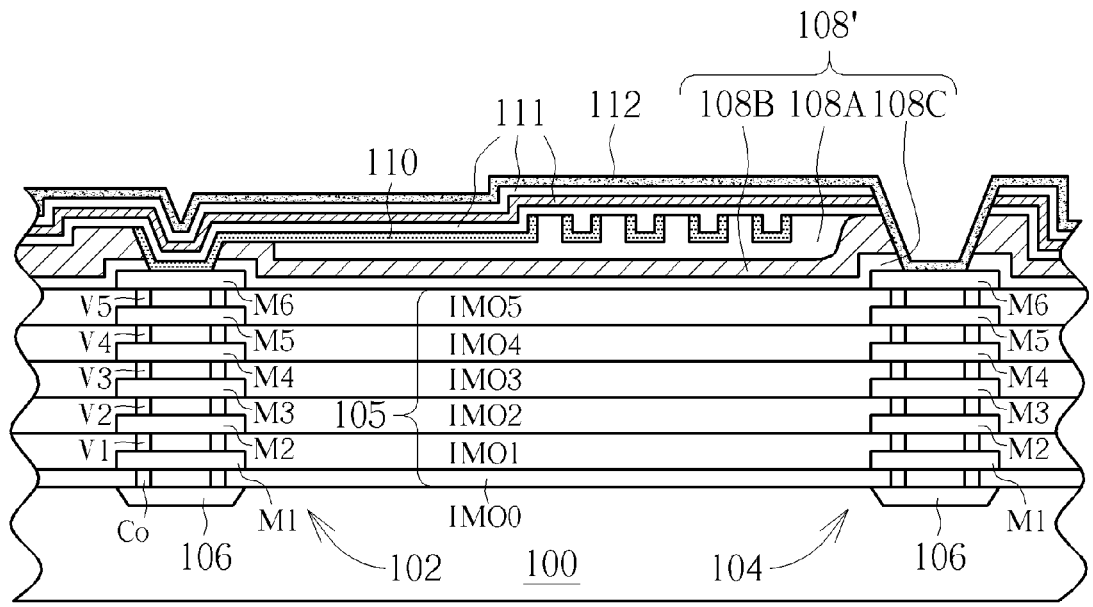
Figure 6:
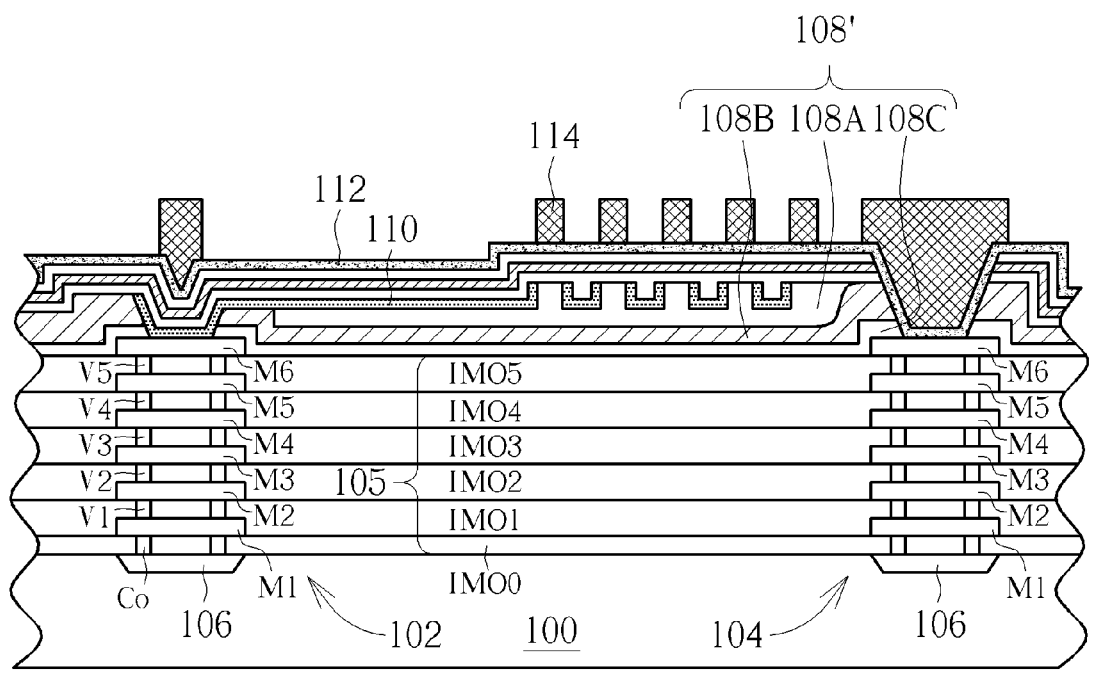
Figure 7:
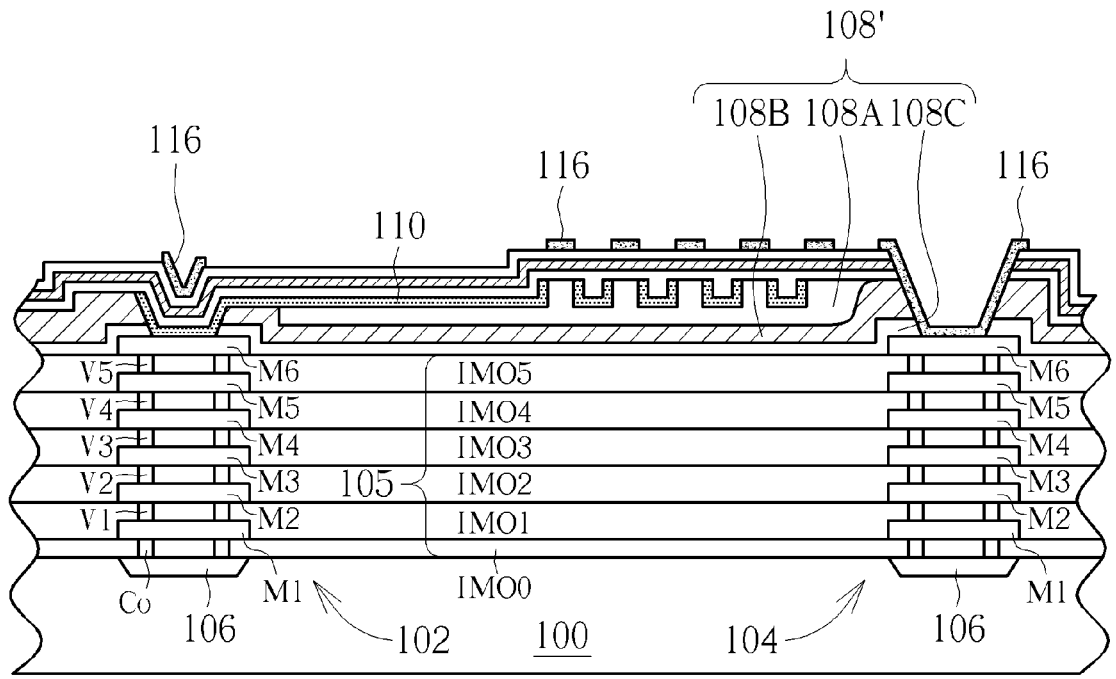

As shown in FIG. 5, a platinum layer 112 is subsequently conformally formed on the patterned second dielectric material layer 111 through a physical vapor deposition (PVD) process, such as a sputtering process and an evaporation process, a chemical vapor deposition (CVD) process, or other thin-film deposition processes. In order to prevent metal elements of the platinum layer 112 form penetrating into the patterned second dielectric material layer 111, a barrier layer (not shown) can be selectively formed between the platinum layer 112 and the patterned second dielectric material layer 111. The barrier layer may be made of titanium nitride (TiN) or tantalum nitride (TaN). In this exemplary embodiment, a thickness of the platinum layer 112 is around 1000 Angstroms (Å), and a thickness of barrier layer made of TiN is around 400 Angstroms (Å). As shown in FIG. 6 and FIG. 7, a mask layer 114 such as a photoresist layer is formed on the platinum layer 112, and at least an etching process is performed to pattern the platinum layer 112 to form the final platinum structure 116, and the mask layer 114 is later removed. The mask layer 114 is used to define the size and the position of the final platinum structure 116 corresponding to the first electrode 110 which serves as heater. In other words, the final platinum structure 116 could be the contact electrode of a micro-heating apparatus in MEMS technology used to measure the ambient temperature in order to modify the heat amount provided by the first electrode 110, but not limited thereto.

It is appreciated that, an etchant used in the etching process to pattern the platinum layer 112 includes at least a chloride-containing gas and at least a fluoride-containing gas, and further optionally includes a combustion gas such as oxygen and/or a noble gas such as argon. The chloride-containing gas facilitates a removing rate of the platinum layer 112, however, the excessive chloride-containing gas in the etchant may cause the formation of macro-molecular byproducts that are hard to be removed at the sides of the final platinum structure 116, for example, unwanted polymer residual remaining at the sides of the patterned platinum layer, such as fence polymer. In other hands, the fluoride-containing gas in the etchant can cause the formation of volatile byproducts that can be much more easily removed compared to the macro-molecular byproducts; however, the excessive fluoride-containing gas in the etchant may decrease a removing rate of the platinum layer 112, which may increase the manufacturing costs and processing time. Accordingly, the etchant used to pattern the platinum layer 112 preferably includes the chloride-containing gas and the fluoride-containing gas simultaneously, and the gas ratio of the chloride-containing gas and the fluoride-containing gas can be optimized according to the process demands, for example, according to the thickness of the platinum layer, the content of the chloride-containing gas and the content of the fluoride-containing gas. More specifically, the gas ratio of the chloride-containing gas to the fluoride-containing gas in the etchant represents a flow rate of the chloride-containing gas to a flow rate of the fluoride-containing gas, and the gas ratio could be a specific gas ratio or a variable gas ratio during the etching process of patterning the platinum layer.

In this exemplary embodiment, as the chloride-containing gas includes $Cl_2$ or $BCl_3$, and a formula of a component of the fluoride-containing gas having a number of fluorine equal to or lower than six; in other words, the fluoride-containing gas includes $SF_6$, $SF_4$, $CF_4$, $CHF_3$, $CH_2F_2$, $CH_3F$ or a combination thereof. The gas ratio of the chloride-containing gas to the fluoride-containing gas (i.e. a ratio of a flow rate of the chloride-containing gas to a flow rate of the fluoride-containing gas) is preferably substantially equal to or lower than 1, and higher than 0, in order to avoid the fence polymer formation on the final platinum structure 116 and to provide a proper removing rate of the platinum layer to save costs. When the etchant has a specific gas ratio of chloride-containing gas to fluoride-containing gas, and the specific gas ratio is preferably substantially equal to or lower than 1. In another exemplary embodiment, when the etchant has a variable gas ratio of chloride-containing gas to fluoride-containing gas, the variable ratio may range form 0 to 1, and is preferably a gradually decreasing gas ratio, for example, during the patterning process of the platinum layer, a flow rate of the chloride-containing gas preferably decreases, and a flow rate of the fluoride-containing gas preferably increases. The gas ratio of chloride-containing gas to fluoride-containing gas is not limited to be equal to or lower than 1, a number of fluorine in a formula of a component of the fluoride-containing gas and a number of chlorine in a formula of a component of the chloride-containing gas may influence the preferable gas ratio range.

Figure 8:
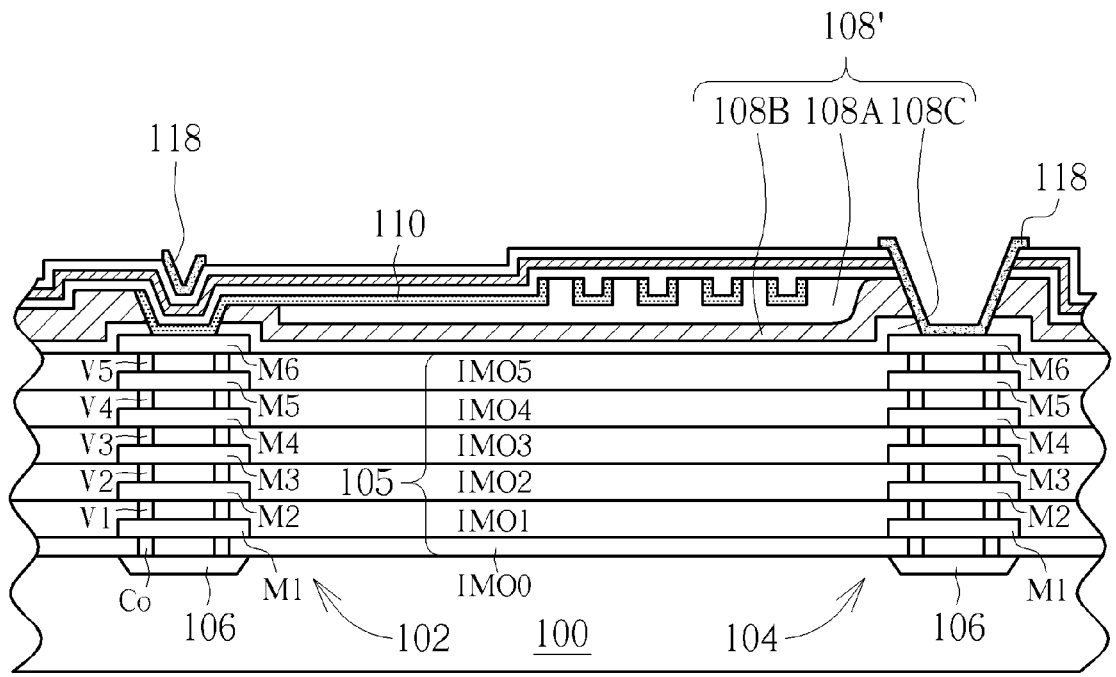
Figure 9:
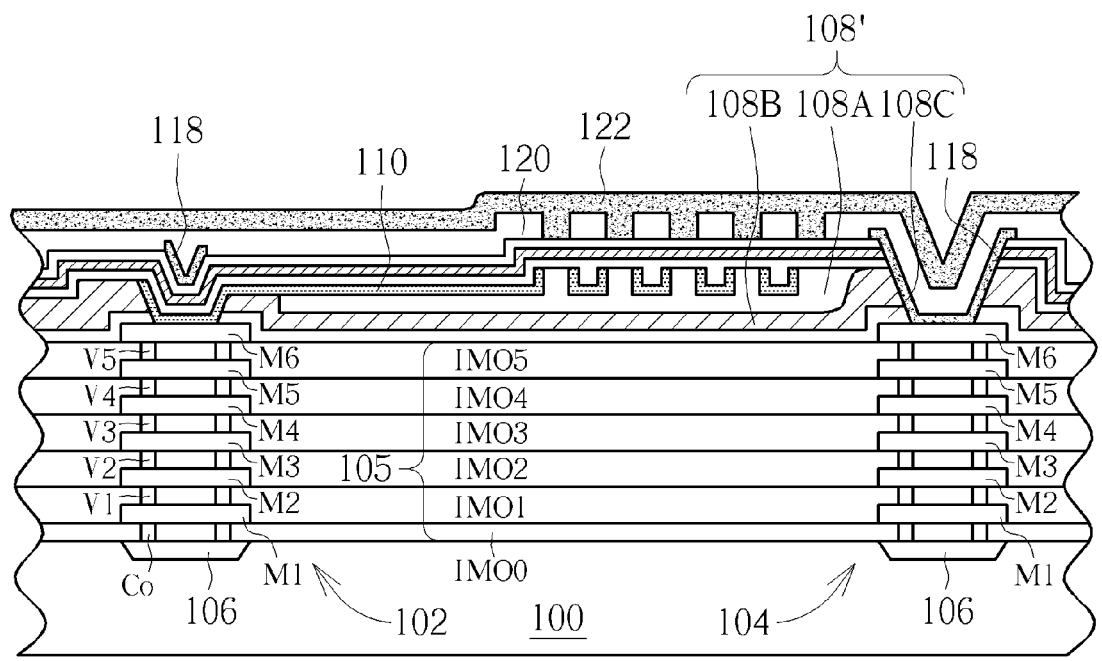
Figure 10:
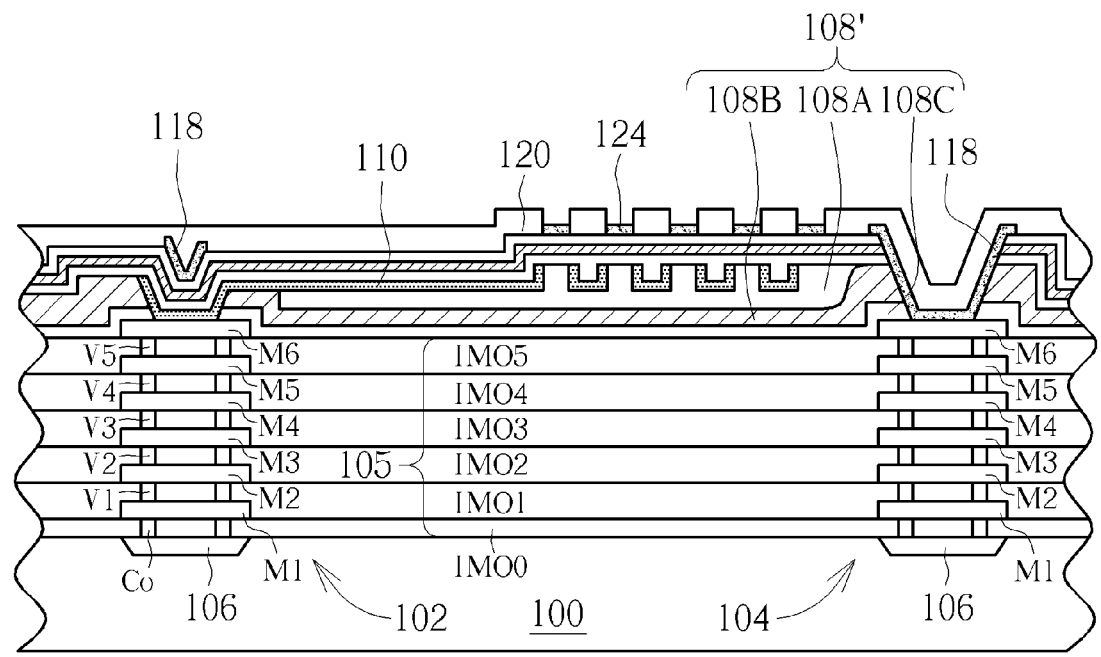

The method of forming the final platinum structure 116 is not limited to as illustrated above. As shown in FIG. 8 and FIG. 10, the final platinum structure can be formed through multiple deposition and etching processes. A first platinum layer (not shown) is conformally formed on the patterned second dielectric material layer 111 through a physical vapor deposition (PVD) process, such as a sputtering process and an evaporation process, a chemical vapor deposition (CVD) process, or other thin-film deposition processes. Then, a first mask layer (not shown) such as a photoresist layer is formed on the first platinum layer, and at least a first etching process is performed to pattern the first platinum layer to form the first platinum structure 118, and the first mask layer is later removed. Similarly, after forming a patterned dielectric layer 120 covering the first platinum structure 118, a second platinum layer 122 is conformally formed on the patterned dielectric layer 120. Then, a second mask layer (not shown) such as a photoresist layer is formed on the second platinum layer 122, and at least a second etching process is performed to pattern the second platinum layer 122 to form the second platinum structure 124, and the second mask layer and the patterned dielectric layer 120 are later removed to complete the final platinum structure. A width of a pattern in the first platinum structure 118 is substantially larger than a width of a pattern in the second platinum structure 124; in other words, the final platinum structure can be divided into the first platinum structure 118 and the second platinum structure 124 according to the size of the pattern, but not limited thereto. It is appreciated that, a first etchant used in the second etching process and a second etchant used in the second etching process to pattern the first platinum layer and the second platinum layer respectively include at least a chloride-containing gas and at least a fluoride-containing gas, and further optionally includes a combustion gas such as oxygen and/or a noble gas such as argon.

Figure 11:
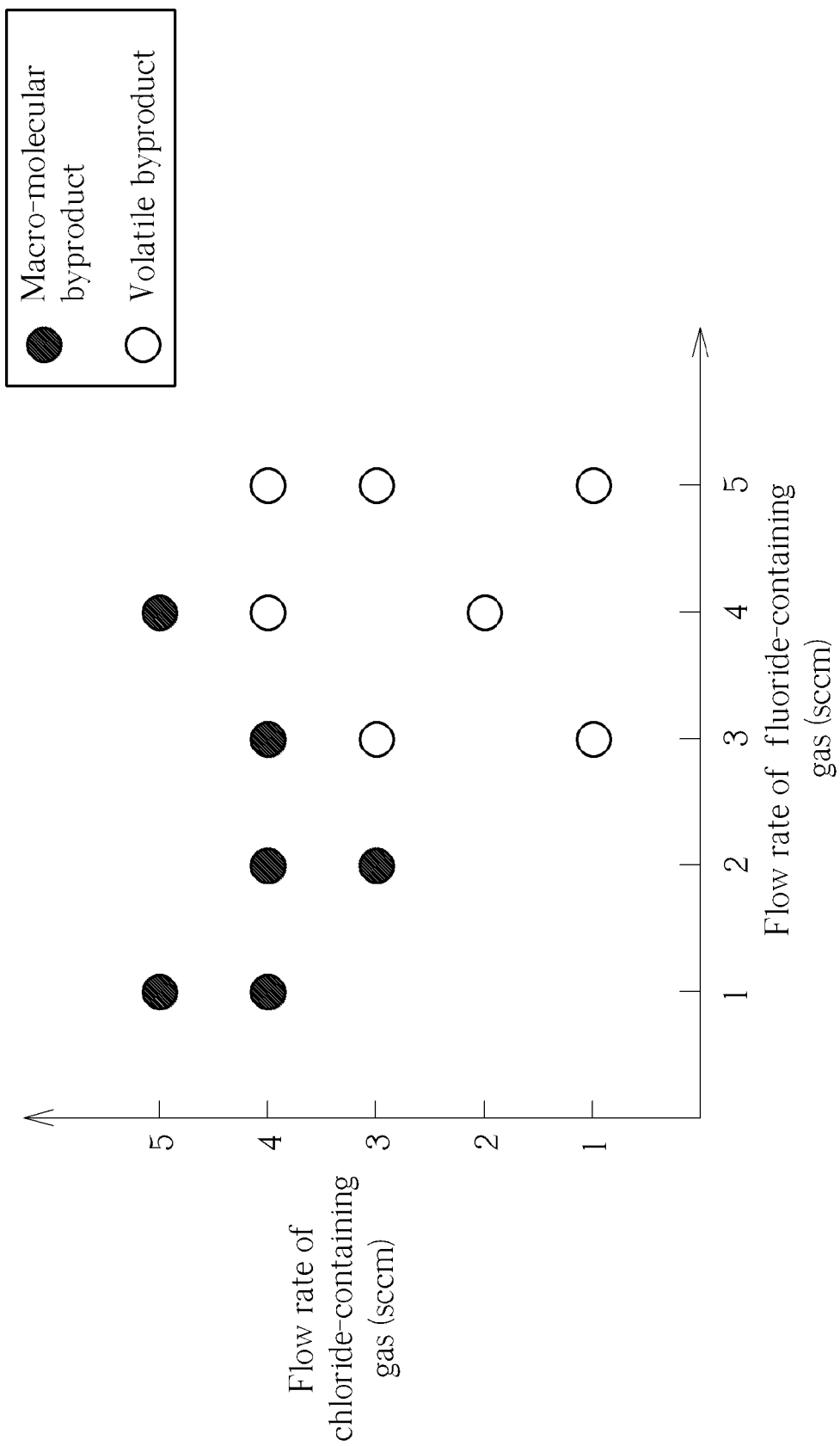
FIG. 11 is a diagram of a relation between a flow rate of the chloride-containing gas to a flow rate of the fluoride-containing gas according to exemplary embodiments of the present invention.

Please refer to FIG. 11. FIG. 11 illustrates a diagram of a relation between a flow rate of the chloride-containing gas to a flow rate of the fluoride-containing gas according to exemplary embodiments of the present invention. The unit of the flow rate could be standard-state cubic centimeter per minute (sccm). The solid dots show that the macro-molecular byproducts such as fence polymers are formed at the sides of the patterned platinum layer, as the flow rate of the chloride-containing gas is substantially higher than the flow rate of the fluoride-containing gas. In other hands, the hollow dots show that the volatile byproducts are formed instead of the macro-molecular byproducts, i.e. the fence polymers are not found at the sides of the patterned platinum layer, as the flow rate of the chloride-containing gas is substantially equal to or lower than the flow rate of the fluoride-containing gas. Consequently, in the present invention, the etchant used to pattern a platinum layer preferably includes the chloride-containing gas and the fluoride-containing gas simultaneously, and the ratio of the flow rate of the chloride-containing gas to the flow rate of the fluoride-containing gas is preferably equal to or lower than 1, as the formula of the component of the fluoride-containing gas has a number of fluorine preferably equal to or lower than six.

In conclusion, the platinum layer is preferably patterned by using the etchant including simultaneously the chloride-containing gas and the fluoride-containing gas to reduce the polymer residues formation. More specifically, the chloride-containing gas facilitates a removing rate of the platinum layer, but may cause the formation of macro-molecular byproducts that are hard to be removed at the sides of the patterned platinum layer, such as fence polymer. The fluoride-containing gas used in the etching process may cause the formation of volatile byproducts that can be easily removed, but have a lower removing rate of the platinum layer than that of the chloride-containing gas. Accordingly, the gas ratio of the chloride-containing gas to the fluoride-containing gas should be modified to be substantially equal to or lower than 1 and higher than 0, in order to avoid the fence polymer formation and improve the platinum patterning process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of patterning a platinum layer, comprising:
   providing a substrate;
   forming a platinum layer on the substrate; and
   performing an etching process to pattern the platinum layer, wherein an etchant used in the etching process comprises at least a chloride-containing gas and at least a fluoride-containing gas, and a flow rate of the chloride-containing gas is substantially lower than a flow rate of the fluoride-containing gas.

2. The method of patterning a platinum layer according to claim 1, wherein the etchant comprises a specific gas ratio of the chloride-containing gas to the fluoride-containing gas.

3. The method of patterning a platinum layer according to claim 1, wherein the etchant comprises a variable gas ratio of the chloride-containing gas to the fluoride-containing gas.

4. The method of patterning a platinum layer according to claim 3, wherein the variable gas ratio comprises a gradually decreasing gas ratio.

5. The method of patterning a platinum layer according to claim 3, wherein the variable gas ratio of the chloride-containing gas to the fluoride-containing gas comprises a variable ratio of a flow rate of the chloride-containing gas to a flow rate of the fluoride-containing gas, and the variable gas ratio ranges from 0 to 1.

6. The method of patterning a platinum layer according to claim 1, wherein the fluoride-containing gas comprises $SF_6$, $SF_4$, $CF_4$, $CHF_3$, $CH_2F_2$, $CH_3F$ or a combination thereof.

7. The method of patterning a platinum layer according to claim 1, wherein a formula of a component of the fluoride-containing gas has a number of fluorine equal to or lower than six.

8. The method of patterning a platinum layer according to claim 1, wherein the chloride-containing gas comprises $Cl_2$ or $BCl_3$.

9. The method of patterning a platinum layer according to claim 1, wherein the etchant further comprises a combustion gas.

10. The method of patterning a platinum layer according to claim 9, wherein the combustion gas comprises oxygen.

11. The method of patterning a platinum layer according to claim 1, wherein the etchant further comprises a noble gas.

12. The method of patterning a platinum layer according to claim 11, wherein the noble gas comprises argon.

13. The method of patterning a platinum layer according to claim 1, further comprising forming a barrier layer between the platinum layer and the substrate.

14. The method of patterning a platinum layer according to claim 13, wherein the barrier layer is made of titanium nitride (TiN) or tantalum nitride (TaN).

15. The method of patterning a platinum layer according to claim 1, wherein the substrate further comprises at least one conductive element stack and at least one dielectric layer disposed under the platinum layer.

* * * * *